(12) United States Patent
Daems et al.

(10) Patent No.: US 6,551,759 B2
(45) Date of Patent: Apr. 22, 2003

(54) DIRECT-TO-PLATE FLEXOGRAPHIC PRINTING PLATE PRECURSOR

(75) Inventors: Eddy Daems, Herentals (BE); Frank Ruttens, Overijse (BE); Guy Damen, Kasterlee (BE); Luc Leenders, Herentals (BE)

(73) Assignee: Agfa-Gevaert, Mortsel (BE)

( * ) Notice: Subject to any disclaimer, the term of this patent is extended or adjusted under 35 U.S.C. 154(b) by 68 days.

(21) Appl. No.: 09/809,049

(22) Filed: Mar. 16, 2001

(65) Prior Publication Data

US 2002/0009672 A1 Jan. 24, 2002

Related U.S. Application Data

(60) Provisional application No. 60/214,016, filed on Jun. 26, 2000.

(30) Foreign Application Priority Data

Jun. 13, 2000 (EP) .............................. 00202100

(51) Int. Cl.$^7$ ................................ G03F 7/095
(52) U.S. Cl. ................ 430/273.1; 430/5; 430/306; 430/309
(58) Field of Search ................. 430/306, 309, 430/273.1

(56) References Cited

U.S. PATENT DOCUMENTS

| | | | |
|---|---|---|---|
| 4,264,705 A | 4/1981 | Allen | 430/271.1 |
| 5,066,864 A | 11/1991 | Brandner et al. | 250/484.1 |
| 5,925,500 A | 7/1999 | Yang et al. | 430/273.1 |

FOREIGN PATENT DOCUMENTS

| | | | |
|---|---|---|---|
| EP | 0 741 330 A1 | | 11/1996 |
| EP | 0 908 778 A2 | | 4/1999 |
| WO | wo-96/14603-a1 | * | 5/1996 |
| WO | WO 01/18604 A3 | | 3/2001 |
| WO | WO 01/18604 A2 | | 3/2001 |

* cited by examiner

Primary Examiner—Cynthia Hamilton
(74) Attorney, Agent, or Firm—Breiner & Breiner, L.L.C.

(57) ABSTRACT

A direct-to-plate flexographic printing plate precursor is disclosed including in the order given, a flexible support, a photopolymerizable layer containing an elastomeric binder, an image recording layer including a thermoplastic binder and optionally a cover layer characterized in that the image recording layer and the photopolymerizable layer can be liquefied so that they can be penetrated to a depth of at least 5% at a temperature of 110° C. by a ballpoint probe having a diameter of 3 mm, which is subjected to a force of 0.1 N. Furthermore, a method is provided for making a direct-to-plate if lexographic printing plate precursor.

5 Claims, No Drawings

DIRECT-TO-PLATE FLEXOGRAPHIC PRINTING PLATE PRECURSOR

This application is based on provisional application Serial. No. 60/214,016 filed Jun. 26, 2000.

DESCRIPTION

1. Field of the Invention

The present invention relates to a direct-to-plate flexographic printing plate precursor, more specifically to a flexographic printing plate precursor that can be developed thermally without the use of aqueous or organic processing solutions.

Furthermore the present invention relates to a method for making a direct-to-plate flexographic printing plate.

2. Background of the Invention

Flexographic printing plates are used for printing on soft and deformable surfaces such as plastic films, cardboard etc. Flexographic printing plate precursors typically contain a photopolymerizable layer comprising an elastomeric binder, a monomer and a photoinitiator. Conventionally, a photosensitive negative or positive of the desired image is used as a contact mask for the flood exposure of the photopolymerizable layer. In computer-to-plate technology, the conventional contact mask is replaced by a mask that is integrated within the printing plate precursor. Such an integrated mask can be provided by printing with an ink jet printer on the photopolymeric plate or by providing the polymeric plate with an ablatable image-recording layer that is substantially opaque to actinic radiation. This material may be called a direct-to-plate flexographic printing plate precursor.

Direct-to-plate flexographic printing plate precursors have been described in e.g. EP-A n° 99113770.4, WO-A-96 16356, EP-A-767 407, WO-A-94 03838 and WO-A-94 03839. These patents describe flexographic printing plate precursors comprising on a support a photopolymerizable layer and an IR-sensitive image-recording layer. Flexographic printing plates are produced by image-wise laser exposure inducing ablative removal to form a mask, UV flood exposure through the mask and development with an aqueous or organic solution. Such developing steps are time consuming and therefor expensive. In addition, potentially toxic waste products are produced.

In EP-A-468 745, EP-A-468 667 and U.S. Pat. No. 5,215,859 conventional flexographic printing plate precursors are described comprising photopolymerizable polyurethane resins that can be developed thermally without requiring the use of aqueous or organic developing solutions as described in EP-A-469 735. This patent discloses a device to produce flexographic printing plates wherein the image-wise exposed photopolymerizable layer of the flexographic printing plate precursor is heated for a time and to a temperature sufficient to cause the unexposed areas to liquefy. Then the photopolymerizable layer is contacted with an absorbent material at a pressure sufficient for a portion of the liquefied areas to be absorbed. This step is repeated several times to clean up the unexposed areas.

However, when the above described prior art direct-to-plate flexographic printing plate precursors are applied in such a device problems arise since the integrated mask can not be thermally liquefied sufficiently. This prevents the removal of the integrated mask together with the unexposed, liquefied areas of the photopolymerizable layer.

SUMMARY OF THE INVENTION

It is an object of the present invention to provide a material for making a direct-to-plate flexographic printing plate precursor that can be developed without the use of aqueous or organic processing solutions.

It is a further object of the present invention to provide a method for making a direct-to-plate flexographic printing plate precursor.

The above mentioned objects are realized by the material and the method as defined by the independent claims.

A material for making a direct-to-plate flexographic printing plate precursor that can be developed thermally without the use of aqueous or organic processing solutions is obtained by providing an image recording layer and a photopolymerizable layer that each can be liquefied so that they can be penetrated to a depth of at least 5% at a temperature of 110° C. by a ballpoint probe having a diameter of 3 mm, which is subjected to a force of 0.1N. Upon imaging and flood exposure the image-recording layer and the photopolymerizable layer are liquefied by heating. Thereafter the image-recording layer is removed together with the unexposed areas of the photopolymerizable layer by using an absorbent material.

DETAILED DESCRIPTION OF THE INVENTION

It has been found that, according to the present invention, a direct-to-plate flexographic printing plate precursor can be obtained that can be developed thermally without the use of aqueous or organic processing solutions. Hereto a thermoplastic binder with a glass transition temperature preferably below 65° C. is incorporated in the image recording layer and the photopolymerizable layer so that each can be penetrated to a depth of at least 5% at a temperature of 110° C. by a ballpoint probe. Penetration depths were measured with a Mettler TMA40 thermo mechanical analyzer. Thereto a 100 $\mu$m thick image recording layer or photopolymerizable layer was coated on a glass support and dried. A quartz ballpoint probe having a diameter of 3 mm was positioned on the surface of the image recording layer or photopolymerizable layer. A force of 0.1 N was applied onto the ballpoint probe while heating the material and the probe in an oven from 30° C. to 160° C. at a speed of 10° C./min. The penetration depth (%) is determined as follows at a temperature of 110°:

Relative penetration depth=[absolute depth ($\mu$m)/absolute thickness of the image recording layer ($\mu$m)]×100

Preferred thermoplastic binders for use in the image recording layer are polyesters, poly(meth)acrylates, polyvinylacetates or copolymers thereof or elastomeric polyurethane resins. Suitable commercially available binders are Dynapol S1404 (from Huls A. G.), Carboset 525 (from Goodrich), Mowilith CT5 (from Hoechst), Vitel VPE5545 (from Goodyear) and Vinnapas B100 (from Wacker Chemie).

According to the present invention the image recording layer is preferably a laser ablatable layer that further comprises a light absorbing compound. Preferred light absorbing compounds are IR-absorbing dyes such as phthalocyanines or derivatives, cyanine dyes, merocyanine dyes and polymethine dyes or inorganic pigments such as carbon black, graphite, iron oxide or chromium oxide. Preferably carbon black is used. Furthermore carbon black renders the ablatable layer opaque to UV radiation, so there is no need to add an additional UV-absorbing dye. It is particularly preferred to use fine-grained carbon black with a mean particle size below 30 nm which is commercially available as Printex® U, Printex® L6, Specialschwarz 4 or Specialschwarz 250 (all trademarks from Degussa).

Suitable supports for the imaging material of the present invention are flexible but dimensionally stable materials such as films of polyethylene therephthalate, cellulose triacetate, polyethylene naphthalate, polybutylene terephthalate or polycarbonate that have a sufficiently high modulus. Also metal supports can be used.

A photopolymerizable layer containing an elastomeric binder is provided onto the support. A preferred elastomeric binder is a photopolymerizable polyurethane resin derived from polymer forming reactions of (a) 10–50% by weight of at least one diisocyanate, (b) 0.5–20% by weight of a first chain extension agent having at least two free hydrogen groups and having at least one ethylenically unsaturated addition polymerizable group per molecule (optionally, a second chain extension agent may be present having at least two free hydrogen groups (0.5–20% by weight)) and (c) 10–70% by weight of an organic polyol having a molecular weight of at least 500 and containing at least two free hydrogen groups per molecule. The polyurethane resins used in the present invention have a molecular weight of at least 10.000 and a glass transition temperature of less than 65° C. The polyurethane resins belong to a class of polymers known as segmented copolymers or multiphase polymers. The elastomeric properties of these polymers result from phase separation between so called 'hard' segment domains and 'soft' segment domains. The two phases are thought to exist as separate phases within the polymer. 25–70% of the segment domains are 'soft' segment domains. The photopolymerizable layer further comprises a free radical photoinitiator (0.5 to 8% by weight of the elastomer). Other additives such as dyes, pigments or fillers can be present.

Optionally a primer layer is provided between the support and the photopolymerizable layer. This layer preferably comprises aziridine functional compounds. The aziridine functional compounds are used in an amount of at least 10% by weight solids of the primer layer. The aziridine functional compounds may be diluted with solids that comprise inert compatible polymeric organic binders, coupling agents, particulates, comonomers, other priming agents and the like. The aziridine functional compound may also contain other functional groups. Preferably these groups are not reactive with the aziridine functionality under ambient conditions. Thus, for example, the aziridine-functional compound may also contain one or more hydroxyl groups. Specific examples of aziridine functional compounds can be found in WO-A-92 21069.

Furthermore according to the present invention an antistatic layer can be present between the photopolymerizable layer and the image recording layer. Preferably a vanadium oxide antistatic layer is applied as described in EP-A-573 365.

Optionally a cover layer can be applied on top of the image recording layer. Suitable cover layers comprise films of polyethylene terephthalate, cellulose triacetate, polypropylene, and polyethylene. Also resin coated paper or carriers coated with a release agent such as carnauba wax, organic silicones, tetrafluoroethylene telomers etc. can be used.

According to the method of the present invention, after optional removal of the cover layer the flexographic printing plate precursor is image-wise exposed to form a mask. Preferred devices used for image-wise exposure are Nd/YAG lasers (1064 nm) or diode lasers (e.g. 830 nm). After the image-wise exposure the material is subjected to flood exposure with UV-light through the mask. Subsequently the flexographic printing plate precursor is developed by contacting the image recording layer with an absorbent material while heating by convection, conduction or other heating methods to a temperature sufficiently high to liquefy the unexposed areas of the photopolymerizable layer and the mask. Hereby the unexposed areas of the photopolymerizable layer as well as the mask are thermally liquefied and transferred onto the absorbent material. Preferably the flexographic printing plate precursor is heated to a temperature between 50° C. and 130° C. The absorbent material has preferably a melting or softening temperature higher than the melting temperature of the elastomeric polyurethane resin and the thermoplastic binder of the image recording layer. The absorbent material is selected from non-woven web materials, paper stocks, fibrous woven materials, open-celled foam materials, porous sheets or other sheet materials which contain , more or less, a substantial fraction of their included volume as void volume. Preferably non-woven web materials made from polyesters, nylon or other high temperature melting thermoplastic polymers are used. Suitable commercially available non-woven web materials are Cerex (James River Corporation) and Soft Wipers White cleaning cloth (no. 010932 from EVI). In order to remove all the unexposed material together with the mask, the absorbent material is preferably contacted with the image recording layer at least three times. After separation of the absorbent material and cooling to room temperature, the flexographic printing plate can be mounted onto a printing press.

EXAMPLES

While the present invention will hereinafter be described in connection with preferred embodiments thereof, it will be understood that it is not intended to limit the invention to those embodiments.

Image Recording Layer

A laser recordable composition was prepared from a coating solution containing the following ingredients as listed in table 1:

TABLE 1

| | Coating composition (g) | | | |
| --- | --- | --- | --- | --- |
| | Sample | | | |
| Component | I | II | III | IV |
| Special Schwarz 250 (Degussa) (Carbon black pigment) | 3.42 | 3.42 | 3.42 | 3.42 |
| Dynapol S1404 (Hüls) (Thermoplastic binder) | 4.80 | / | / | / |
| Neocryl B723 (Zeneca Resins) (Thermoplastic binder) | / | 4.80 | / | / |
| Dynapol L912 (Hüls) (Thermoplastic binder) | / | / | 4.80 | / |
| Waloran E950 (Wolff Walrode) (Binder) | / | / | / | 4.80 |
| Solsperse 5000 (Zeneca Resins) (Dispersion agent) | 0.07 | 0.07 | 0.07 | 0.07 |
| Solsperse 28000 (Zeneca Resins) (Dispersion agent) | 0.34 | 0.34 | 0.34 | 0.34 |
| Baysilon NA (Bayer) (Coating aid) | 0.10 | 0.10 | 0.10 | 0.10 |
| MEK/ethylacetate (1:1 v/v) | 90.9 | 90.9 | 90.9 | 90.9 |

These solution were coated onto a Persalic-LF-50 film (50 $\mu$m PETP film from Perlen Converting coated on one side with a silicon release agent) by means of a 30 $\mu$m coating knife and dried for 2 min. at 45° C. yielding an image recording layer with a dry coating weight of 2.7 g/m$^2$ having an optical density in the UV region of >4.0.

Photopolymerizable Layer

A photopolymerizable polyurethane elastomeric composition was prepared in a twin-screw extrusion reactor as follows:

I. A polyol mixture was prepared of the following components which were thoroughly mixed in a feed tank until homogeneous:

A. 286.1 parts (0.2861 moles) of a 1000 molecular weight poly 1,2-(butylene oxide) diol (Dow Chemical Co.);

B. 32.8 parts (0.3644 mole) of 1,4-butane diol (GAF Chemical Co.)

C. 10.7 parts (0.0669 mole) of 2-glycerol methacrylate (3M Co.);
D. 10.6 parts of diethoxy acetophenone (Irgacure-651, Ciba-Geigy Co.
E. 0.1 part methylene blue
F. 0.06 part ferric chloride
G. 0.26 part dibutyl tin dilaurate II. A precision flow metering system was utilized to meter the above polyol stream into the inlet port of a 64 mm twin-screw counter rotating extruder (Leistritz Co.) at a ratio of 62.47 parts by weight of polyol stream to 37.53 parts by weight 4,4-bis (isocyanato cyclohexyl)methane (Desmodur W TM , Mobay Chemical Co.). At this mass ratio, there was a slight equivalency excess of isocyanate moieties in the feed stream relative to hydroxyl moieties. The reaction temperature of the polymerizing mass was maintained in the range of 150 to 170° C. as polymerization occurred in the extruder. Upon exiting from the extruder, the fully reacted curable elastomer composition was segregated into pellets having diameters of approximately 0.3 cm which were collected for further processing. The completeness of the polymerization reaction was determined by monitoring the infrared spectrum of a cast film of the photopolymerizable elastomer product and determining the absorbance ratio of the —NCO absorption band (2250 cm–1) to the —CH2— absorption band (2950 cm–1). A ratio of less than 0.2 indicated a complete reaction with only a slight excess of —NCO groups remaining.

The fully reacted photopolymerizable polyurethane elastomeric composition consisted of the following mole ratios of constituents:

| Component | Amount (Moles) |
| --- | --- |
| 4,4'-bis(isocyanato cyclo-hexyl)methane | 2.730 |
| 1,4 butane diol | 1.274 |
| 2-glycerol methacrylate | 0.234 |
| Poly 1,2(butyl oxide)diol | 1.000 |

The above polyurethane elastomeric composition was re-extruded between a 175 μm PET that has been coated with a tris-aziridine adhesive layer and the image recording layers provided on the Persalic-LF-50 film. This film now acts as cover film.

Image-wise Exposure

The cover film was first removed from the image recording layer and then the flexographic printing plate precursor was image-wise exposed with a NdYLF laser (1064 nm) having a spot size of 18 μm, at a pitch of 10 μm and at a scan speed of 2 m/s. The image plane power was set between 200 and 450 mW with intervals of 50 mW.

Preparation of the Flexographic Printing Plate

After image-wise laser exposure the flexographic printing plate precursor was flood exposed through the thus formed mask with UV radiation (4000 μW/cm$^2$) for 20 min. Then the flexographic printing plate precursor was developed using a Codor LPP 650 laminator at 120° C. Thereto the flexographic printing plate precursor was contacted with a Soft Wipers White cleaning cloth (no. 010932 from EVI)and passed through the lamination rollers (speed 35 cm/min). The cleaning cloth was replaced after each passage through the rollers and the optical density on the printing plate was measured (see results).

Results

Before development and after the first three cleaning cycles the optical density on the printing plate was measured (table 2).

TABLE 2

| Sample | $D_{max}$ Cleaning cycles | | | | $\Delta D_{max}$ | Relative penetration depth (%) |
| --- | --- | --- | --- | --- | --- | --- |
| | Start | 1 | 2 | 3 | | |
| I | 3.01 | 1.23 | 0.97 | 0.82 | 2.19 | 80.3 |
| II | 3.68 | 2.54 | 2.26 | 1.86 | 1.82 | 9.0 |
| III | 2.20 | 2.20 | 2.13 | 2.13 | 0.07 | 4.1 |
| IV | 3.87 | 3.87 | 3.85 | 3.83 | 0.04 | 0.0 |

From the $\Delta D_{max}$ results in table 2 it may be concluded that after 3 cleaning cycles the image recording layer as well as the non-exposed areas of the photopolymerizable layer were removed for sample I and II. In sample III and IV the image recording layer was not removed after 3 cleaning cycles. Even after 8 cleaning cycles the image recording layer was not completely removed.

The flexographic printing plates obtained in sample I and II were mounted on a printing press and produced excellent prints.

What is claimed is:

1. Direct-to-plate flexographic printing plate precursor comprising in the order given, a flexible support, a photopolymerizable layer containing an elastomeric binder, an image recording layer comprising a thermoplastic binder and optionally a cover layer characterized in that said image recording layer and said photopolymerizable layer can each be liquefied so that they can be penetrated to a depth of at least 5% at a temperature of 110° C. by a ballpoint probe having a diameter of 3 mm, which is subjected to a force of 0.1 N.

2. Direct-to-plate flexographic printing plate precursor according to claim 1 wherein said thermoplastic binder is a polyester, a poly(meth)acrylate, a polyvinylacetate or a copolymer thereof or an elastomeric polyurethane resin.

3. Direct-to-plate flexographic printing plate precursor according to claim 1 wherein said image recording layer is a laser ablatable layer.

4. Direct-to-plate if flexographic printing plate precursor according to claim 1 wherein said elastomeric binder is a polyurethane resin.

5. Method for making a flexographic printing plate comprising the steps of:

providing a direct-to-plate flexographic printing plate precursor according to claim 1, 2, 3 or 4;

optionally removing the cover layer;

image-wise exposing the image recording layer to form a mask;

flood exposing the photopolymerizable layer through the mask;

contacting the mask with an absorbent material;

heating the photopolymerizable layer and the mask while in contact with the absorbent material thereby removing the unexposed areas of the photopolymerizable layer together with the mask.

* * * * *

UNITED STATES PATENT AND TRADEMARK OFFICE
CERTIFICATE OF CORRECTION

PATENT NO. : 6,551,759 B2
DATED : April 22, 2003
INVENTOR(S) : Eddie Daems et al.

It is certified that error appears in the above-identified patent and that said Letters Patent is hereby corrected as shown below:

<u>Title page,</u>
Item [75], Inventors, "Eddy Daems" should read -- Eddie Daems --.

<u>Column 6,</u>
Line 43, delete "if" before "flexographic".

Signed and Sealed this

Twelfth Day of August, 2003

JAMES E. ROGAN
*Director of the United States Patent and Trademark Office*